United States Patent
Park et al.

(10) Patent No.: US 8,982,606 B2
(45) Date of Patent: Mar. 17, 2015

(54) PHASE CHANGE MEMORY DEVICE HAVING MULTI-LEVEL AND METHOD OF DRIVING THE SAME

(71) Applicant: SK hynix Inc., Icheon-si (KR)

(72) Inventors: Hae Chan Park, Ichon-si (KR); Se Ho Lee, Ichon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/494,382

(22) Filed: Sep. 23, 2014

(65) Prior Publication Data

US 2015/0009753 A1    Jan. 8, 2015

Related U.S. Application Data

(62) Division of application No. 13/706,745, filed on Dec. 6, 2012, now Pat. No. 8,842,461, which is a division of application No. 12/641,523, filed on Dec. 18, 2009, now Pat. No. 8,351,240.

(30) Foreign Application Priority Data

Jun. 15, 2009    (KR) .................. 10-2009-0052726

(51) Int. Cl.
*G11C 11/00*    (2006.01)
*G11C 13/00*    (2006.01)

(52) U.S. Cl.
CPC ........ *G11C 13/0069* (2013.01); *G11C 13/0004* (2013.01); *G11C 13/004* (2013.01)
USPC .................... 365/148; 365/151; 365/189.03

(58) Field of Classification Search
CPC ..................... G11C 13/004; G11C 13/0069
USPC .................... 365/148, 151, 189.03
See application file for complete search history.

(56) References Cited

U.S. PATENT DOCUMENTS

| | | |
|---|---|---|
| 6,359,460 B1 | 3/2002 | Tanaka |
| 6,678,187 B2 * | 1/2004 | Sugibayashi et al. ......... 365/158 |
| 6,778,426 B2 | 8/2004 | Hosotani |
| 6,795,334 B2 | 9/2004 | Iwata et al. |
| 7,245,526 B2 | 7/2007 | Oh et al. |
| 7,286,394 B2 | 10/2007 | Ooishi |

(Continued)

FOREIGN PATENT DOCUMENTS

| | | |
|---|---|---|
| CN | 1747058 A | 3/2006 |
| KR | 10-0801345 B1 | 1/2008 |

(Continued)

OTHER PUBLICATIONS

U.S. Appl. No. 12/641,523, Restriction Requirement, mailed Feb. 9, 2012.

(Continued)

*Primary Examiner* — Viet Q Nguyen
(74) *Attorney, Agent, or Firm* — Kilpatrick Townsend & Stockton LLP

(57) ABSTRACT

A phase change memory device having a multi-level and a method of driving the same are presented. The disclosed phase change memory device includes variable resistors and shifting units. The variable resistors are interchanged into set and reset states in response to an applied current. The shifting units, which are connected to the variable resistors, shift resistance distribution in the set and reset state of the variable resistors by a predetermined level.

5 Claims, 14 Drawing Sheets

(56) References Cited

U.S. PATENT DOCUMENTS

| | | |
|---|---|---|
| 7,443,721 B2 | 10/2008 | Kurotsuchi et al. |
| 7,463,506 B2 | 12/2008 | Muraoka et al. |
| 7,492,630 B2 | 2/2009 | Scheuerlein et al. |
| 7,542,326 B2 | 6/2009 | Yoshimura et al. |
| 7,606,059 B2 | 10/2009 | Toda |
| 7,660,148 B2 | 2/2010 | Yokoi |
| 7,679,048 B1 | 3/2010 | Aziz et al. |
| 7,692,949 B2 | 4/2010 | Nirschl |
| 7,692,950 B2 | 4/2010 | Rhie |
| 7,701,749 B2 | 4/2010 | Jeong et al. |
| 7,738,290 B2 | 6/2010 | Nakai |
| 7,889,539 B2 * | 2/2011 | Rinerson et al. ............... 365/148 |
| 7,898,840 B2 | 3/2011 | Maejima |
| 7,952,909 B2 | 5/2011 | Inoue et al. |
| 7,969,798 B2 | 6/2011 | Hwang et al. |
| 7,983,076 B2 | 7/2011 | Shin |
| 8,027,184 B2 * | 9/2011 | Katou ............................ 365/158 |
| 8,059,446 B2 | 11/2011 | Symanczyk |
| 8,111,538 B2 | 2/2012 | Hosotani et al. |
| 8,264,905 B2 * | 9/2012 | Choi et al. ............... 365/230.06 |
| 8,289,764 B2 * | 10/2012 | Hanzawa ....................... 365/163 |
| 8,351,240 B2 * | 1/2013 | Park et al. ..................... 365/148 |
| 8,367,513 B2 * | 2/2013 | Nagashima ................... 438/382 |
| 8,395,199 B2 * | 3/2013 | Nagashima ................... 257/298 |
| 8,411,488 B2 | 4/2013 | Kawabata et al. |
| 8,445,880 B2 | 5/2013 | Park |
| 8,842,461 B2 * | 9/2014 | Park et al. ..................... 365/148 |
| 2008/0316804 A1 | 12/2008 | Jeong et al. |
| 2010/0103726 A1 | 4/2010 | Bae et al. |
| 2010/0208511 A1 | 8/2010 | Rhie et al. |
| 2010/0211725 A1 | 8/2010 | Nagashima et al. |
| 2011/0164447 A1 | 7/2011 | Arita et al. |
| 2012/0014164 A1 | 1/2012 | Kamoshida et al. |
| 2013/0094285 A1 | 4/2013 | Park et al. |

FOREIGN PATENT DOCUMENTS

| | | |
|---|---|---|
| KR | 1020090006634 A | 1/2009 |
| WO | 2009/051276 A1 | 4/2009 |

OTHER PUBLICATIONS

U.S. Appl. No. 12/641,523, Non-Final Office Action, mailed Apr. 11, 2012.

U.S. Appl. No. 12/641,523, Notice of Allowance, mailed Sep. 7, 2012.

U.S. Appl. No. 13/706,745, Restriction Requirement, mailed Oct. 10, 2013.

U.S. Appl. No. 13/706,745, Non-Final Office Action, mailed Jan. 13, 2014.

U.S. Appl. No. 13/706,745, Notice of Allowance, mailed May 23, 2014.

* cited by examiner

PHASE CHANGE MEMORY DEVICE HAVING MULTI-LEVEL AND METHOD OF DRIVING THE SAME

CROSS-REFERENCES TO RELATED PATENT APPLICATION

The present application is a divisional of U.S. patent application Ser. No. 13/706,745, filed Dec. 6, 2012, which is a divisional of U.S. Pat. No. 8,351,240, issued Jan. 8, 2013, which claims priority under 35 U.S.C 119(a) to Korean Application No. 10-2009-0052726, filed on Jun. 15, 2009, in the Korean Intellectual Property Office. This application is also related to U.S. patent application Ser. No. 14/494,355, filed Sep. 23, 2014, titled "PHASE CHANGE MEMORY DEVICE HAVING MULTI-LEVEL AND METHOD OF DRIVING THE SAME", and U.S. patent application Ser. No. 14/494,403, filed Sep. 23, 2014, titled "PHASE CHANGE MEMORY DEVICE HAVING MULTI-LEVEL AND METHOD OF DRIVING THE SAME". All of the above are incorporated herein by reference in their entireties as set forth in full.

BACKGROUND

1. Technical Field

The present invention relates to a memory device and a method of driving the same, and more specifically, to a phase change memory device having a multi-level and a method of driving the same.

2. Related Art

Materials chosen for phase change memory devices, such as PRAMs, are those types of materials that are able to be easily and reversibly interconvert between different solid state phases by being subjected or driven by changes in temperature. Another desirable property for materials in future phase change memory devices is that the different solid state phases exhibit measurably different resistances. Due to these and other physiochemical properties, it is thought that phase change materials might be exploited as key constituents in future memory devices which are capable of storing massive amounts of data via correlations between the measured resistances and the corresponding solid state phase of the phase change material.

A typical phase change memory device can be configured to include a plurality of word lines, a plurality of bit lines that intersect the plurality of word lines that define unit memory cells, one switching element that selects the word lines, and variable resistors that receive and store data from the bit lines by the driving of the switching element.

It has been reported that such a phase change memory device can obtain a value of an intermediate state along with binary states, i.e., states that can be correlated with "0" and "1" in accordance to the particular solid state phase of a phase change material layer.

However, the phase change material layer of the currently popular GST group generally exhibit two discrete linear resistance types corresponding to a highly ordered crystalline state and an highly disordered amorphous state. However, the resistance distribution of phase change materials that exhibit intermediate level solid states may be nonlinear.

For this reason, in order to realize a multi-level, a current condition for writing set (0) or reset (1) data and a current having various levels should be supplied to the phase change material. To this end, separate pumping circuits are needed. Although various currents are supplied by the additional pumping circuits, the phase change material layer does not have a clear resistance distribution at levels other than the set and reset levels, such that a reading error can occur.

As a result, there is a problem in that the phase change memory device having the multi-level current is required to have a layout that arranges the plurality of pumping circuits as described above, which cannot obtain the complete multi-level.

SUMMARY

The phase change memory device can include: variable resistors that are changed into set and reset states according to an applied current; and shifting units that are connected to the variable resistors and shift resistance distribution in the set and reset state of the variable resistors by a predetermined level.

The phase change memory device can also includes: a cell array that includes a plurality of memory cells, wherein the memory cell includes: first switching elements that are connected to first word lines; second switching elements that are connected between the first switching elements and second word lines; and variable resistors that are connected between the first switching elements and bit lines.

The phase change memory device can also include: a cell array that includes a plurality of memory cells including bit lines and first and second word lines intersecting the bit lines; and a control block that is arranged outside the cell array and is configured to control the bit lines and the word lines. At this time, the memory cell includes variable resistors that are connected to the bit lines and shifting units that are connected to the variable resistors and are controlled by the first and second word lines.

Another variation is that the phase change memory device can include: a semiconductor substrate where a cell area and peripheral areas are divided; first and second word line select switches that are formed on an upper part of the semiconductor substrate of the peripheral areas at both sides based on the cell area; first word lines that are formed to be electrically connected to the first word line select switches on the upper part of the semiconductor substrate on which the first word line select switches are formed; a plurality of first diodes that are formed on the upper parts of the first word lines; second word lines that are formed on the upper parts of the plurality of first diodes; second diodes that are formed on the upper parts of the second word lines to correspond to the first diodes; heating electrodes that are formed on the upper parts of the second diodes to correspond to each of the second diodes; phase change patterns that are formed on the upper parts of the heating electrodes to contact each of the heating electrodes; and bit lines that are formed on the upper parts of the phase change patterns and formed to be electrically connected to the phase change patterns.

There is also provided a method of driving a phase change memory device that includes variable resistors that change into set and reset states according to a current applied from bit lines, shifting units that are connected to the variable resistors and shift resistance distribution in the set and reset states of the variable resistors by a predetermined level, and memory cells that include a plurality of word lines controlling the shifting units, the method of driving a phase change memory including: when writing and reading the memory cells, selecting and grounding one of the plurality of word lines and supplying a voltage necessary for the writing and reading via the bit lines in the state of floating the remaining word lines.

Another the provided method of driving a phase change memory device is that it can include bit lines, variable resistors that are electrically connected to the bit lines, first switching elements that are connected to the variable resistors, second switching elements that are electrically connected to the first switching elements, and memory cells including first word lines that control the first switching elements and second word lines that control second switching elements, the method of driving a phase change memory including: when writing the memory cells, grounding the first word lines and writing a first set state and a first reset state by applying the set voltage and the reset voltage preset via the bit lines in the state of floating the second word lines and floating the first word line and writing a second set state and a second reset state by applying the set voltage and the reset voltage via the bit lines in the state of grounding the second word lines.

These and other features, aspects, and embodiments are described below in the section "Detailed Description."

BRIEF DESCRIPTION OF THE DRAWINGS

Features, aspects, and embodiments are described in conjunction with the attached drawings, in which:

FIGS. 3A to 3D are diagrams showing a process for writing first set and reset states in the memory cell according to the embodiment, wherein FIG. 3A is a circuit diagram for writing the first set state in the memory cell, FIG. 3B is a circuit diagram for writing the first reset state in the memory cell, FIG. 3C is a graph showing resistance distribution of the memory cell, and FIG. 3D is a graph showing current characteristics with respect to a voltage of the memory cell;

FIGS. 4A to 4D are diagrams showing a process for writing second set and reset states in the memory cell according to the embodiment, wherein FIG. 4A is a circuit diagram for writing the second set state in the memory cell, FIG. 4B is a circuit diagram for writing the second reset state in the memory cell, FIG. 4C is a graph showing a resistance distribution of the memory cell, and FIG. 4D is a graph showing current characteristics with respect to a voltage of the memory cell;

DESCRIPTION OF EXEMPLARY EMBODIMENT

Hereinafter, an exemplary embodiment of the present invention will be described with reference to the accompanying drawings.

Figure 1:
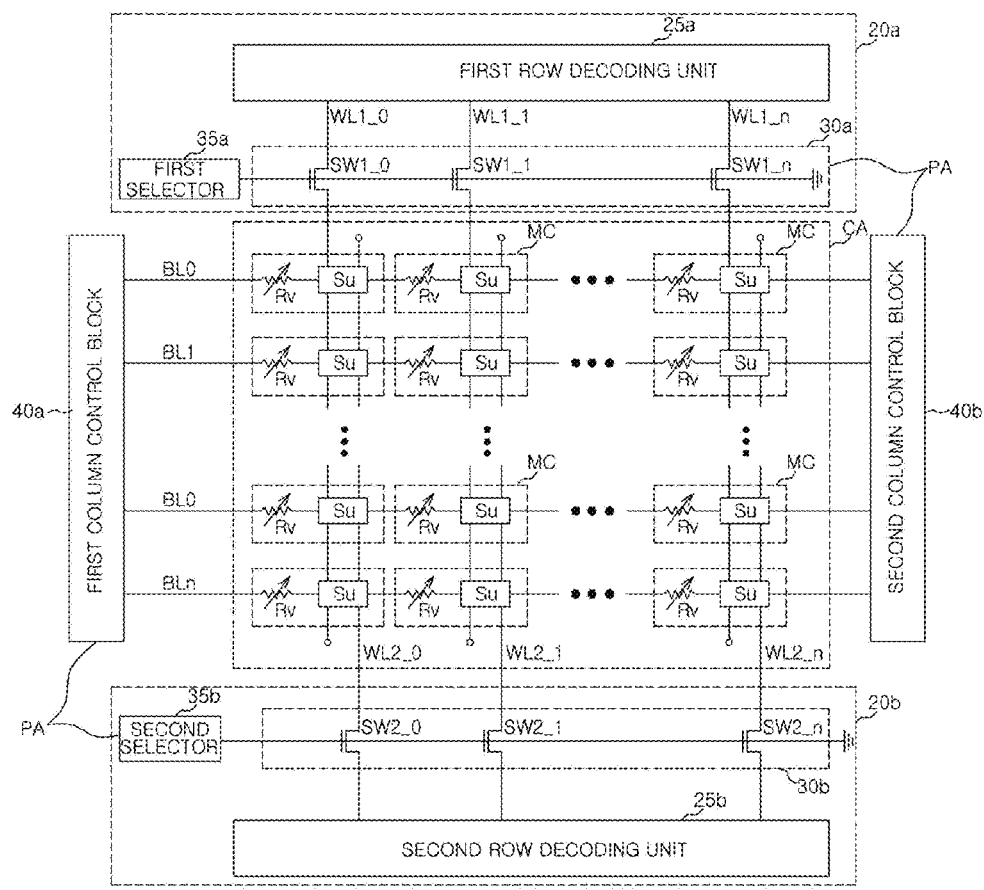
FIG. 1 is a diagram showing a configuration of a phase change memory device according to one embodiment.

FIG. 1 is a diagram schematically showing a configuration of a phase change memory device according to one embodiment.

Referring to FIG. 1, a phase change memory device 10 can be divided into a cell array 'CA' and peripheral areas 'PA'.

The cell array 'CA' is configured to include a plurality of memory cells 'MCs' that are defined by the intersection of a plurality of word lines 'WL1_0 to WL1_$n$ and WL2_0 to WL2_$n$' and a plurality of bit lines 'BL0 to BLn'.

Figure 2:
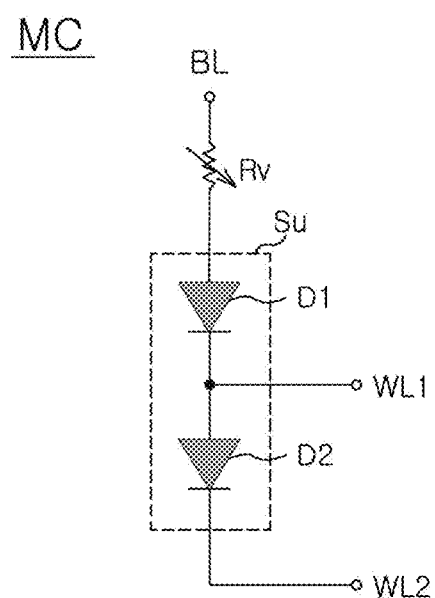
FIG. 2 is a circuit diagram showing a memory cell of the phase change memory apparatus according to one embodiment.

As shown in FIG. 2, the memory cell 'MC' can be configured to include a variable resistor 'Rv' and a shifting unit 'Su'. The variable resistor 'Rv' is coupled between one bit line 'BL0 to BLn' and the shifting unit 'Su' to allow a phase change according to currents supplied from the bit lines 'BL0 to BLn', thereby storing data.

The shifting units 'Su' are coupled to each of the first word lines 'WL1_0 to WL1_$n$' and the second word lines 'WL2_0 to WL2_$n$' and receives signals from the first word lines 'WL1_0 to WL1_$n$' and the second word lines 'WL2_0 to WL2_$n$' as control signals. The shifting unit 'Su' distributes the resistance distribution for the set and reset states of the variable resistor 'Rv' to a normal state or to a state shifted by a predetermined voltage, respectively, according to the selective driving of the first and second word lines 'WL1_0 to WL1_$n$ and WL2_0 to WL2_$n$'. As a result, the phase change memory device can realize various levels.

The shifting unit 'Su' can be configured to include a plurality of switching elements having a threshold voltage. The shifting unit 'Su' according to the embodiment can be configured to include first and second diodes 'D1 and D2' that are coupled in series. The first diode 'D1' is coupled between the variable resistor 'Rv' and the second diode 'D2'. The variable resistor 'Rv' is coupled to an anode side of the first diode 'D1' and an anode of the second diode 'D2' is connected to a cathode side of the first diode 'D1'. In addition, in order to control a current path through the shifting unit 'Su', the first word line 'WL1' is connected to the cathode of the first diode 'D1' and the second word line 'WL2' is coupled to the cathode of the second diode 'D2'. The first and second word lines 'WL1 and WL2' are selectively floated or grounded to change the current path through the shifting unit 'Su' to thereby shift the set/reset resistance distribution of the variable resistor 'Rv'.

Meanwhile, the peripheral areas 'PA' are arranged outside the cell array 'CA' and are positioned with blocks that control the plurality of word lines 'WL1_0 to WL1_$n$ and WL2_0 to WL2_$n$' and the plurality of bit lines 'BL0 to BLn'. More specifically, the peripheral area 'PA' can be configured to include first and second row control blocks 20a and 20b that control the plurality of word lines 'WL1_0 to WL1_$n$ and WL2_0 to WL2_$n$' and first and second column control blocks 40a and 40b that control the plurality of bit lines 'BL0 to BLn'.

The first row control block 20a is configured to control the driving of the first word lines 'WL1_0 to WL1_n'. The first row control block 20a can be configured to include a first row decoding unit 25a, a first switch array 30a, and a first selector 35a. The first row control block 20a is disposed at one edge of the cell array 'CA' that is usually perpendicular to the first and second word lines 'WL1_0 to WL1_n and WL2_0 to WL2_n'.

The first row decoding unit 25a selects any one of the plurality of first word lines 'WL1_0 to WL1_n' to supply a ground voltage. The remaining first word lines 'WL1_0 to WL1_n' that are not selected are configured not to apply any signals.

The first switch array 30a is configured to include switches 'SW1_0 to SW1_n', each of which is installed at every first word line 'WL1_0 to WL1_n'. The switches 'SW1_0 to SW1_n' are selectively used to supply signals transmitted from the first row decoding unit 25a to each memory cell 'MC'. The switches 'SW1_0 to SW1_n' can be any type of switches in which it is preferred that they are configured of, for example, nMOS transistors. The first switch array 30a is preferably adjacent to the cell array 'CA' and can be disposed between the cell array 'CA' and the first row decoding unit 25a.

The first selector 35a is configured to control the driving of the first switch array 30a. In other words, the switches 'SW1_0 to SW1_n' forming the first switch array 30a are simultaneously turned-on or turned-off in response to the signal supplied from the first selector 35a.

The second row control block 20b is configured to control the driving of the second word lines 'WL2_0 to WL2_n'. Similar to the layout of the first row control block 20a, the second row control block 20b can be configured to include a second row decoding unit 25b, a second switch array 30b, and a second selector 35b. The second row control block 20a is preferably disposed at the other edge of the cell array 'CA' that is usually perpendicular to the first and second word lines 'WL1_0 to WL1_n and WL2_0 to WL2_n'.

The second row decoding unit 25b selects any one of the plurality of second word lines 'WL2_0 to WL2_n' to supply a ground voltage. The remaining second word lines 'WL2_0 to WL2_n' which are not selected are then configured not to apply any signals.

The second switch array 30b can be configured of a plurality of switches 'SW2_0 to SW2_n' in which each is individually installed at every corresponding second word line 'WL2_0 to WL2_n'. Similar to the first switch array 30a, the second switch array 30a can be configured of nMOS transistors. The second switch array 30b is preferably positioned to be adjacent to the cell array 'CA' and can be disposed between the cell array 'CA' and the second row decoding unit 25b.

The second selector 35b is configured to control the driving of the second switch array 30b.

The first column control block 40a is configured to control, for example, the driving of even numbered bit lines 'BL0, BL2 . . . '. The second column control block 40b is configured to control, for example, the driving of odd numbered bit lines 'BL1, BL3 . . . '. The first column control block 40a can be disposed at one side of the cell array 'CA' that is perpendicular to the bit lines 'BL0 to BLn' and the second column control block 40b can be disposed at the other side of the cell array 'CA' that is perpendicular to the bit lines 'BL0 to BLn'. The first and second column control blocks 40a and 40b can include voltage generation sources that supply a voltage for storing data of '0 (set)', a voltage for storing data of '1 (reset)', and a read voltage.

The driving of the phase change memory device having the above-mentioned configuration will be described by being divided into the write operation and the read operation.

A method of storing (writing) first set/reset states 'SET1 and RESET1' will be first described with reference to FIGS. 3A to 3D.

Figure 3A:
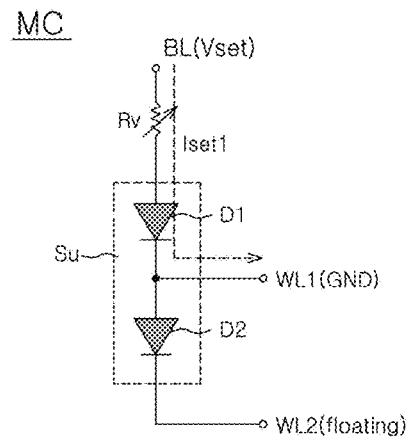

As shown in FIG. 3A, a voltage (hereinafter, referred to as a set voltage 'Vset') for making the variable resistor (Rv), that is, the phase change material into the set state is applied to the bit line 'BL' of the corresponding memory cell 'MC' in which the data will be stored. At the same time, a ground voltage 'GND' is applied to the first word line 'WL1' of the corresponding memory cell 'MC' and the second word line 'WL2' is floated. The selective driving of the first and second world lines 'WL1 and WL2' can be achieved by the first and second row control blocks 20a and 20b.

Thereby, the current (hereinafter, referred to as a first set current 'Iset1') of the memory cell 'MC' flows from the bit line 'BL' to the grounded first word line 'WL1' via the first diode 'D1'.

Therefore, the phase of the variable resistor 'Rv', that is, the phase change material is changed into the set state by the first set current 'Iset1'. The set state 'SET1' means that the phase change material is an ordered crystalline solid state known well in the art. Therefore, as shown in FIG. 3C, the set state has a relatively low resistance distribution. Further, the set state has low resistance distribution as described above. Therefore, as shown in FIG. 3D, the set current 'SET1' having a steep slope is rapidly increased at a threshold voltage 'Vt1' of the first diode 'D1' or more. Herein, the first set state 'SET1' may be the set state of the general phase change memory device.

Figure 3B:
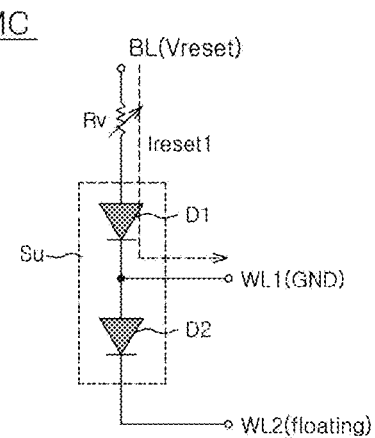
Figure 3C:
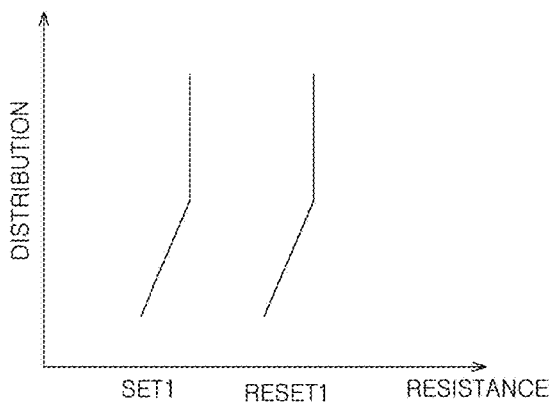
Figure 3D:
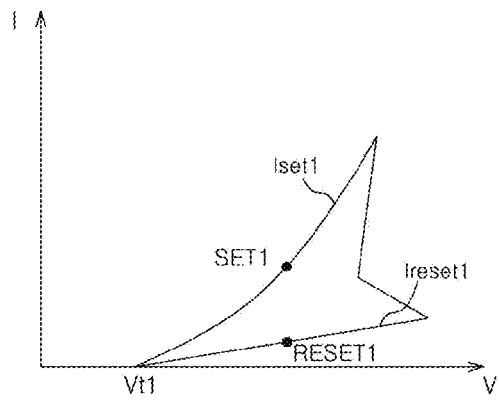

Meanwhile, in the state where the first word line 'WL1' is grounded as shown in FIG. 3A, a voltage (hereinafter, referred to as a reset voltage 'Vreset') for making the phase change material (variable resistor, 'Rv') into a reset state 'RESET1' through the bit line 'BL' as shown in FIG. 3B is applied. Herein, the set and reset states can be divided according to the voltage level applied from the bit line 'BL' and the application method of the bit line 'BL' voltage as described above.

Then, a current 'Ireset1' according to the reset voltage 'Vreset' is supplied to the variable resistor 'Rv', such that the variable resistor 'Rv' has the reset state, that is, the disordered amorphous solid state. As known, the disordered amorphous solid state exhibits a relatively lower resistance than the crystalline state, such that the resistance distribution in the reset state 'RESET1' is relatively higher than the set state 'SET1' as shown in FIG. 3C. Further, as shown in FIG. 3D, in the case of the reset state 'RESET1', it has a relatively low current value 'Ireset1' at the same voltage.

Next, a method of storing (writing) second set/reset states ' SET2 and RESET2' will be described with reference to FIGS. 4A to 4D.

Figure 4A:
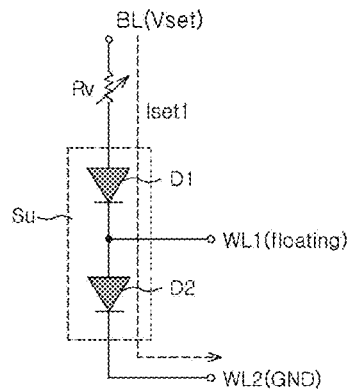
Figure 4B:
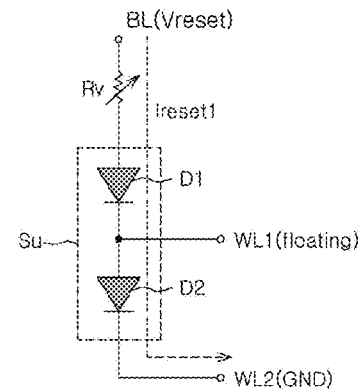

As shown in FIG. 4A, a set voltage 'Vset' is applied to the bit line 'BL' of the corresponding memory cell 'MC' in which data will be stored. At the same time, the ground voltage 'GND' is applied to the second word line 'WL2' of the corresponding memory cell 'MC' and the first word line 'WL1' is floated. The selective driving of the first and second world lines 'WL1 and WL2' can be achieved by the first and second row control blocks 20a and 20b. Further, the voltage 'Vset' for making the second set state 'SET2' is the same as the voltage 'Vset' for making the first set state 'SET1'.

Then, the current (hereinafter, referred to as a second set current 'Iset2') of the memory cell 'MC' flows from the bit line 'BL' to the grounded second word line 'WL2' via the first and second diodes 'D1 and D2'.

Therefore, the phase of the variable resistor 'Rv', that is, the phase change material is changed into the set state by applying the second set current 'Iset2'.

Figure 4C:
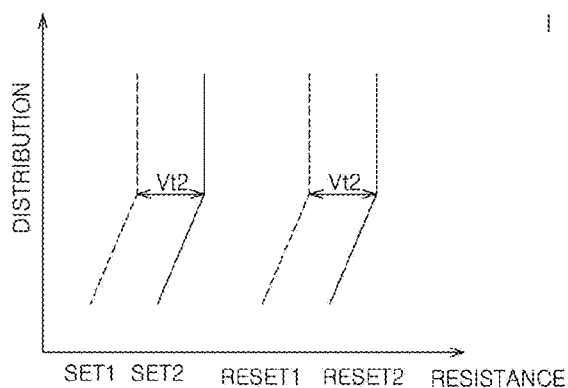

However, the resistance distribution of the second set state 'SET2' is generated at a position shifted by the threshold voltage 'Vt2' of the second diode 'D2' from the voltage distribution of the first set state 'SET1' as shown in FIG. 4C.

Figure 4D:
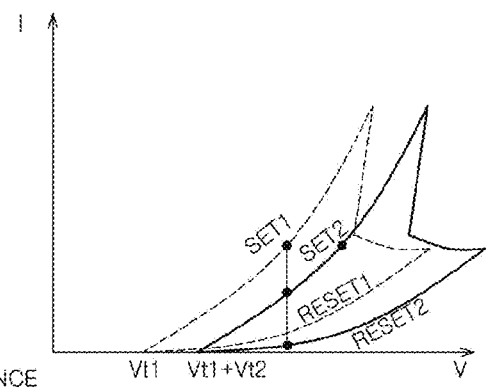

In addition, the second set current 'Iset 2' is rapidly increased at a voltage or more corresponding to the sum of the threshold voltages 'Vt1+Vt2' of the first and second diodes 'D1 and D2' as shown in FIG. 4D, such that the second set current 'Iset2' is distributed in a state shifted by the threshold voltage 'Vt2' of the second diode 'D2' from the distribution of the first set current 'Iset1'.

At this time, the variable resistor 'Rv' is applied with the same set voltage 'Vset' regardless of the first set state 'SET1' and the second set state 'SET2', such that the physical properties (that is, a crystal state) of the variable resistor are the same. However, the second set current 'Iset2' path passes through all of the second diodes 'D1 and D2' unlike the first set current 'Iset1' path, such that the current and resistance are distributed at a position when shifted by the threshold voltage 'Vt' of the second diode 'D2'. Therefore, the multi-level having the clear resistance (current) distribution can be achieved according to the use of the unique threshold voltage of the switching element without causing a change in the physical properties of the variable resistor 'Rv'.

Hereinafter, a method of reading data using one word line will be described with reference to FIGS. 5A, 5B, 6A to 6C, and 7.

Figure 5A:
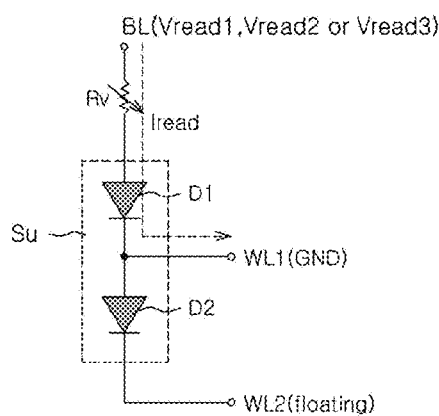
FIG. 5A is a circuit diagram for explaining a method of reading a memory cell according to one embodiment.
Figure 7:
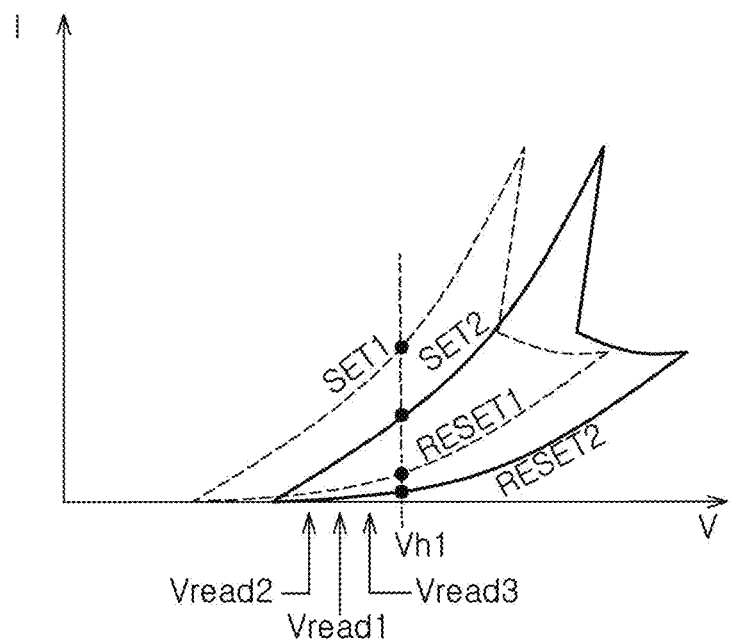
FIG. 7 is a graph showing current characteristics for showing read voltage distribution according to one embodiment.

First, in order to read the data that are stored in the variable resistor 'Rv', the first word line 'WL1' is grounded, the second word line 'WL2' is floated, and then, the first read voltage 'Vread1' is supplied to the memory cell 'MC' via the bit line 'BL' as shown in FIG. 5A. As shown in FIG. 7, the first read voltage 'Vread1' can be a lower value than a first holding voltage 'Vh1', for example, a reference voltage that can divide the set and the reset. In addition, the first holding voltage 'Vh1' can be at a threshold voltage that does not cause a morphological change in the crystal state of the phase change material.

Figure 6A:
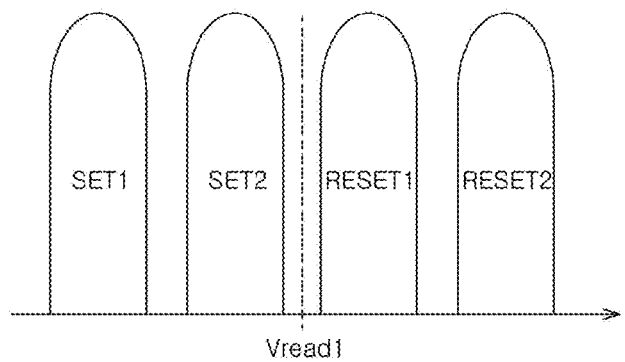
FIGS. 6A to 6C are graphs showing resistance distribution according to a voltage for explaining a method of determining a level depending on a read voltage according to one embodiment.

As described above, when the first read voltage 'Vread1' is applied through the bit line 'BL', as shown in FIG. 6A, it is determined whether the variable resistor 'Rv' belongs to the set group or the reset group based on the first read voltage 'Vread1'. More specifically, it is determined whether the variable resistor 'Rv' corresponds to the second set state 'SET2' and the first reset state 'RESET1' based on the first read voltage 'Vread1'.

Herein, the set group can include the first set state 'SET1' and the second set state 'SET2' and the reset group can include the first reset state 'RESET1' and the second reset state 'RESET2'.

In addition, the division of the set group and the reset group can be determined by the value of the current (hereinafter, referred to as a read current 'Iread') that flows in the grounded first word line 'WL1'. For example, when the value of the read current 'Iread' is found to be at a threshold value or more, it is determined that the resistance distribution is low, such that the variable resistor is divided into the set states 'SET1 and SET2'. When the value of the read current 'Iread' is found to be at a threshold value or less, it is determined that the resistance distribution is high, such that the variable resistor is divided into the reset states 'RESET1 and RESET2'.

Figure 6B:
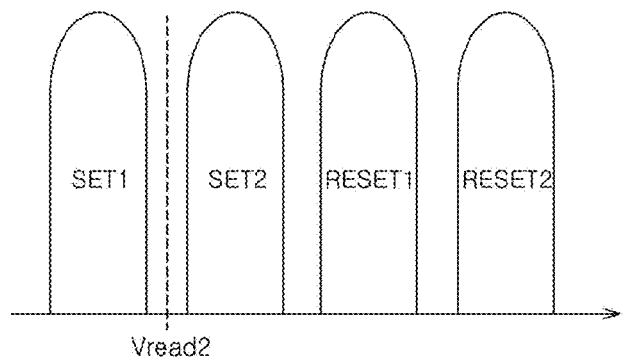

Referring to FIG. 6B, the second read voltage 'Vread2' is applied through the bit line 'BL'. For example, the second read voltage 'Vread2' can be lower than the first read voltage 'Vread1'. Then, it is determined whether the distributed resistance is positioned at a lower band than the second read voltage 'Vread2' or not based on the second read voltage 'Vread2', such that it is divided into the first set state 'SET1' or the second set state 'SET2'. At this time, the first set state 'SET1' and the second set state 'SET2' can be divided by the value of the read current 'Iread' as described above.

Figure 6C:
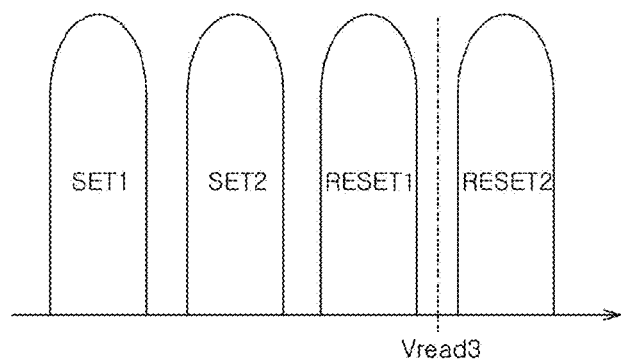

Referring to FIG. 6C, a third read voltage 'Vread3' is applied through the bit line 'BL'. At this time, the third read voltage 'Vread3' should be, for example, larger than the first read voltage 'Vread3' but lower than the holding voltage 'Vh1'. Then, it is determined whether the distributed resistance is positioned at a lower band than the third read voltage 'Vread3' or not based on the third read voltage 'Vread3', such that it is divided into the first reset state 'RESET1' or the second reset state 'RESET2' (S8). The first and second reset states 'RESET1 and RESET2' can also be divided by the difference between the values of the read current 'Iread'

Figure 5B:
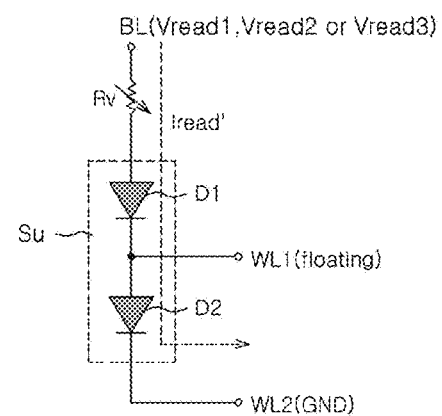
FIG. 5B is a circuit diagram for explaining a method of reading a memory cell according to another embodiment.

Although the embodiment describes an example that grounds the first word line 'WL1' and floats the second word line 'WL2', it can read the multi-level by supplying the first to third read voltages 'Vread1, Vread2, and Vread3', as in the embodiment describing the state of floating the first word line 'WL1' and grounding the second word line 'WL2' shown in FIG. 5B.

In addition, the first to third read voltages 'Vread1, Vread2, and Vread3' can be supplied by using a typical reference voltage generating method without installing a separate voltage driver.

Further, for convenience of explanation, the embodiment described an example that sequentially supplies the first to third read voltages 'Vread1, Vread2, and Vread3' to divide the set group and the reset group and then sub-divides the set group and sub-divides the reset group. However, this order is illustrated by way of example only and since the resistance distribution is detected using the read voltages 'Vread1, Vread2, and Vread3' that are at different levels and thus, the embodiment is not limited to the above-mentioned order. In other words, the second read voltage 'Vread2' or the third read voltage 'Vread3' can be first input to sub-divide the set or reset group. For this reason, the first to third read voltages Vread1, Vread2, and Vread3' should have be at a lower level than the holding voltage 'Vh1'.

With the embodiment, it can supply the read voltages Vread1, Vread2, and Vread3' having different levels in the state of selectively grounding the first word line 'WL1' or the second word line 'WL2' to effectively divide the first and second set states and the third and fourth set states.

In addition, a method of reading data using two word lines will be described with reference to FIGS. 8, 9A, 9B, 10A to 10C, and 11.

Figure 8:
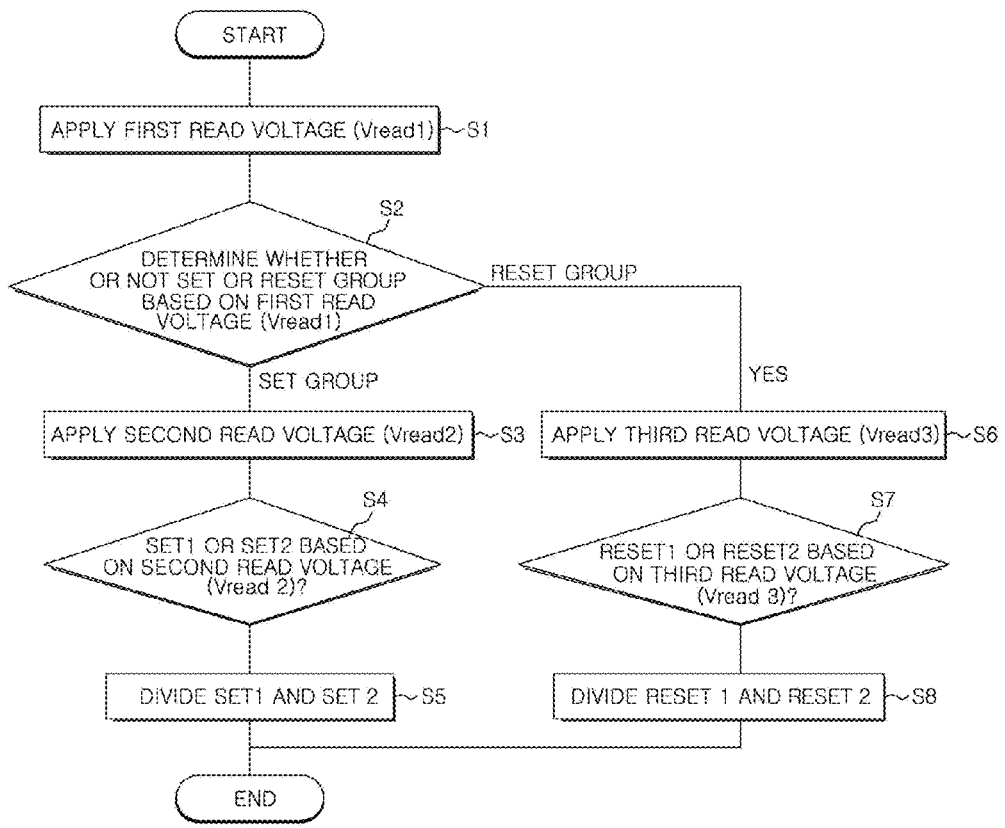
FIG. 8 is a flow chart for explaining a method of driving a phase change memory device according to another embodiment.
Figure 9A:
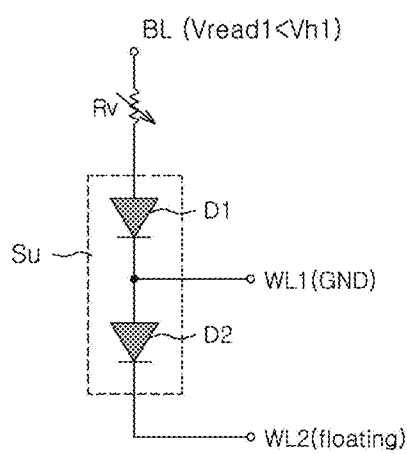
FIGS. 9A and 9B are circuit diagrams for explaining a method of reading the memory cell according to another embodiment.
Figure 11:
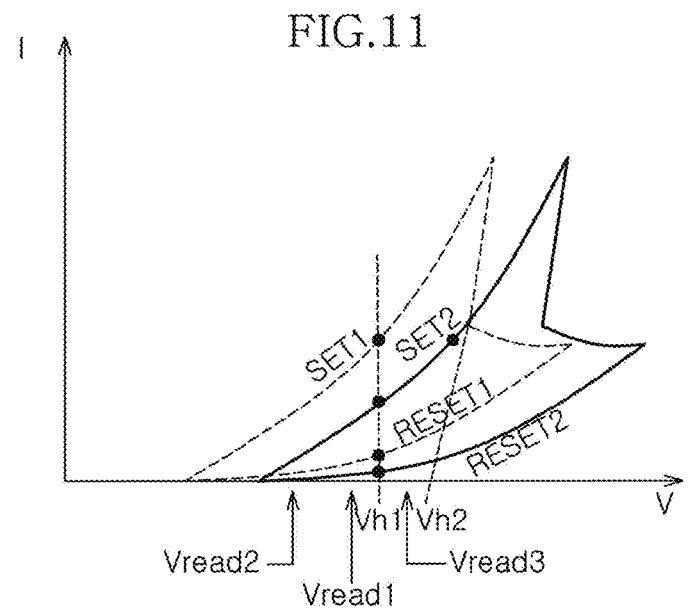
FIG. 11 is a graph showing current characteristics for showing read voltage distribution according to another embodiment.

Referring first to FIGS. 8 and 9A, the first word line 'WL1' is grounded, the second word line 'WL2' is floated, and then, the first read voltage 'Vread1' is supplied to the memory cell 'MC' via the bit line 'BL' (S1). As shown in FIG. 11, the first read voltage 'Vread1' can be at a lower value than a first holding voltage 'Vh1', for example, a reference voltage that can divide the set and the reset.

Figure 10A:
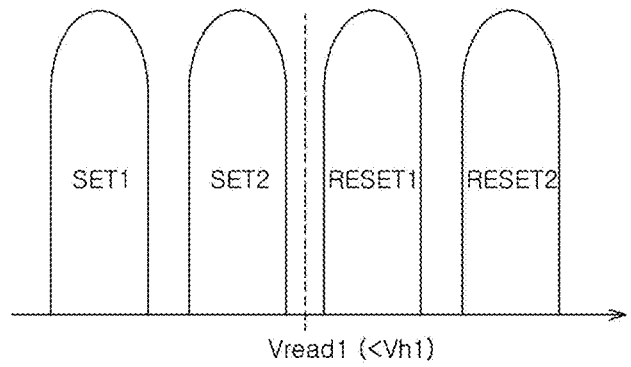
FIGS. 10A to 10C are graphs showing resistance distribution according to a voltage for explaining a method of determining a level depending on a read voltage according to another embodiment.

As described above, when the first read voltage 'Vread1' is applied through the bit line 'BL', it is determined whether the variable resistor 'Rv' corresponds to the set group or the reset group based on the first read voltage 'Vread1' as shown in FIG. 10A (S2). More specifically, it is determined whether the variable resistor 'Rv' corresponds to the second set state 'SET2' and the first reset state 'RESET1' based on the first read voltage 'Vread1'.

Figure 9B:
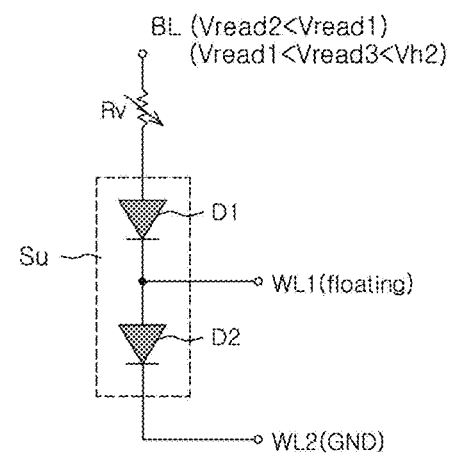
Figure 10B:
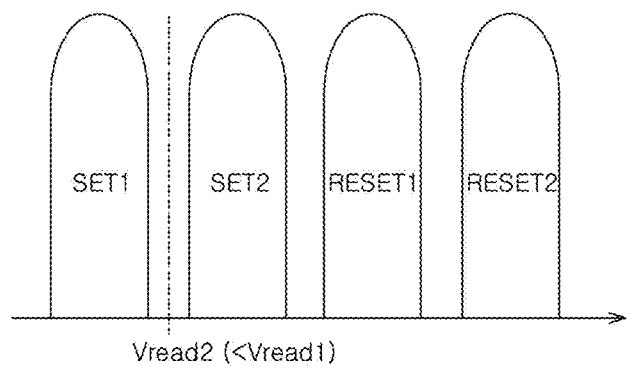

Next, referring to FIGS. 9B and 10B, the set group and the reset group are divided, the first word line 'WL1' is floated, and the second word line 'WL2' is grounded. Thereafter, in order to divide the first and second set states 'SET1 and SET2, the second read voltage 'Vread2' which is lower than the first read voltage 'Vread1' is applied through the bit line 'BL' (S3). Then, it is determined whether the distributed resistance is positioned at a lower band than the second read voltage 'Vread2' or not based on the second read voltage 'Vread2' (S4), such that it is divided into the first set state 'SET1' or the second set state 'SET2' (S5). At this time, the first set state 'SET1' and the second set state 'SET2' can be divided by the value of the read current 'Iread' as described above.

Figure 10C:
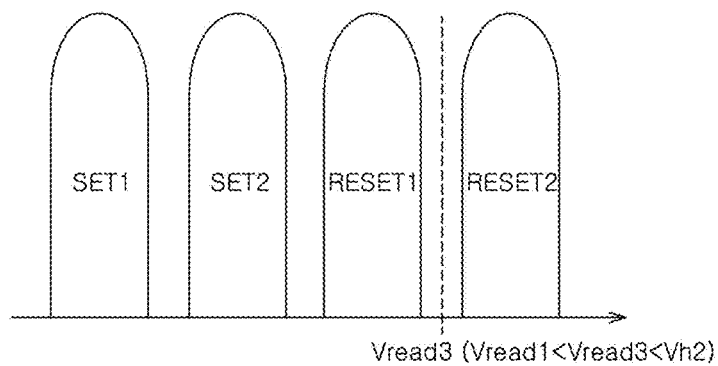

Then, as shown in FIG. 10C, the third read voltage Vread3 which is higher than the first read voltage 'Vread1' is applied through the bit line 'BL' in the state of grounding the second word line 'WL2' (S6). At this time, the third read voltage 'Vread3' is a voltage input in the determined state as the reset group, it is not necessarily the holding voltage 'Vh1'. However, since the third read voltage 'Vread3' should be positioned within an voltage interval where the phase change occurs, it should be set to voltage lower than the phase change maximum voltage 'Vh2'. Therefore, since the interval between the first to third read voltages Vread1, Vread2, and Vread3 can be sufficiently maintained, it is excellent in view of a sensing margin as compared to the case of using one word line.

As such, when the third read voltage 'Vread3' is input, it is determined whether the resistance of the distributed variable resistors 'Rv' is positioned at a lower band than the third read voltage 'Vread3' or not based on the third read voltage 'Vread3' (S7), such that it is divided into the first reset state 'RESET1' or the second reset state 'RESET2' (S8). The first and second reset states 'RESET1 and RESET2' can also be divided by the difference between the values of the read current 'Iread'.

The embodiment grounds the first word line 'WL1', divides the set group and the reset group, and then grounds the second word line 'WL2' to sub-divide the set group and sub-divide the reset group. Since the third read voltage 'Vread3' for dividing the reset group is a voltage input after the variable resistor 'Rv' is previously set in the reset state, it is not necessarily limited only within the range of the holding voltage 'Vh1'. Therefore, if the third read voltage 'Vread3' is selected to be positioned between the holding voltage 'Vh1' and that of the phase change maximum voltage 'Vh2', then the sensing margin of the overall read voltages Vread1, Vread2, and Vread3 is sufficient.

In addition, the typical phase change memory device having one diode and one variable resistor can indicate only two phases, that is, the set and reset. Recently, in order to realize the multi-level by supplying four different voltages to the typical phase change memory device, four levels ' A(SET1), B(SET2), C(RESET1), and D(RESET2)' can be set using four write drivers (or pumps) as shown in FIG. 12.

Figure 12:
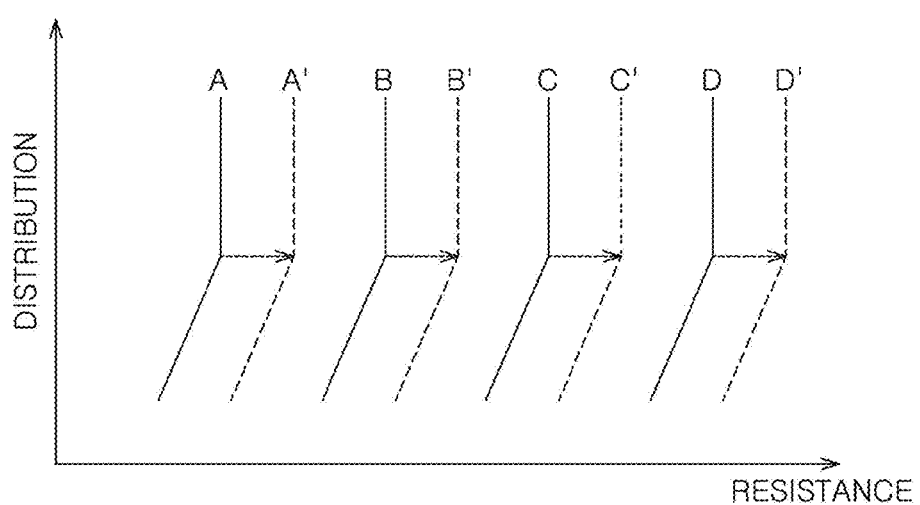
FIG. 12 is a graph showing resistance distribution of a phase change memory device including four write drivers according to another embodiment.

When four write drivers are applied for the phase change memory device according to the embodiment by considering the fact that the typical phase change memory device includes four pumps, a total of 8 levels 'A(SET1), A'(SET3), B(SET2), B'(SET4), C(RESET1), C'(RESET3), D(RESET2), and D(RESET4)' can be obtained, as shown in FIG. 12.

Figure 13:
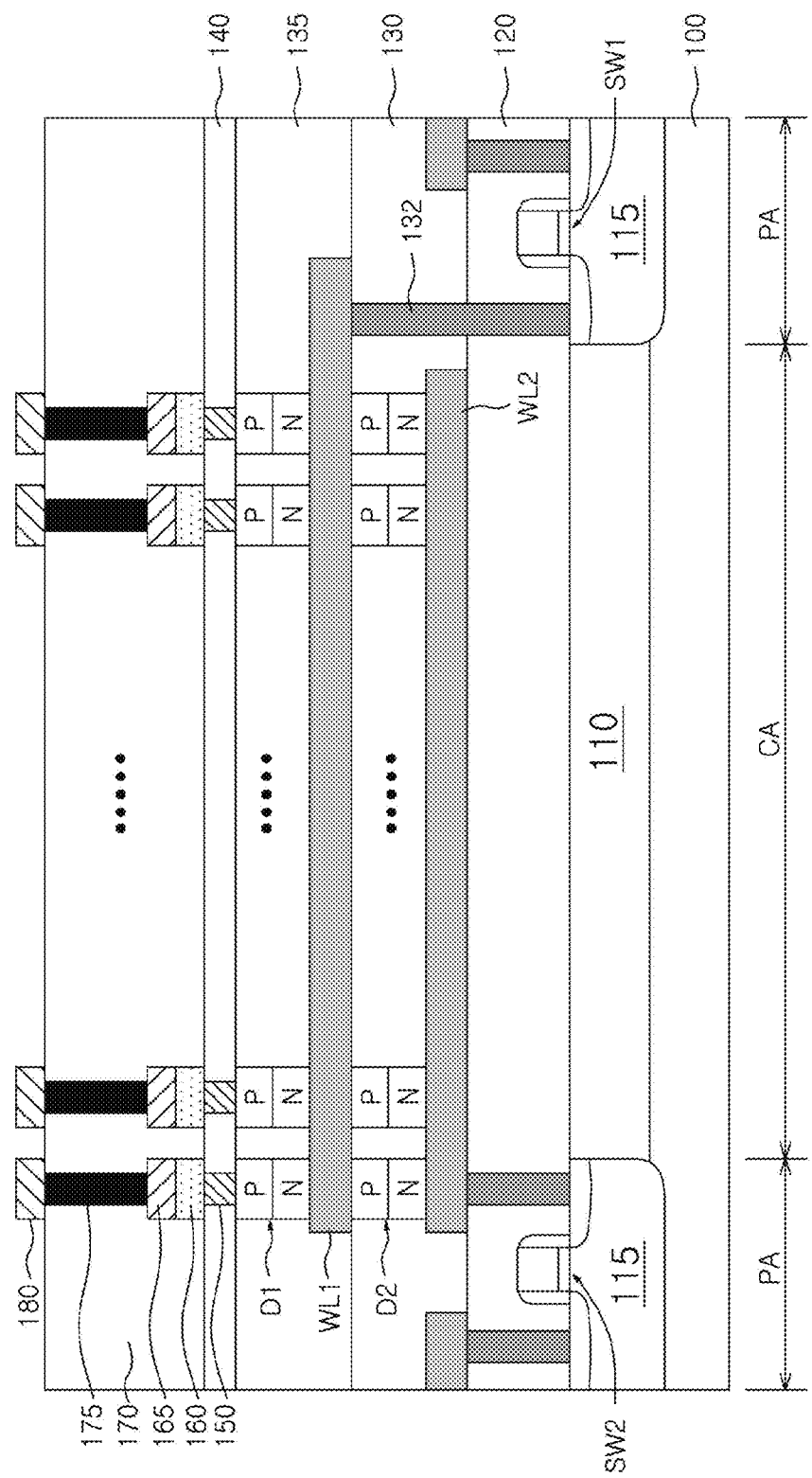
FIG. 13 is a cross-sectional view of the phase change memory device according to one embodiment.

FIG. 13 is a cross-sectional view of the phase change memory device according to one embodiment. FIG. 13 shows a cross section taken along a unit cell column, wherein the column means a progressing direction of word lines.

Referring to FIG. 13, a MOS transistor as the first switch 'SW1' for selecting the first word line 'WL1' is formed at one peripheral area 'PA' and a MOS transistor as a second switch 'SW2' for selecting the second word line 'WL2' is formed at the other peripheral area 'PA', based on the cell area 'CA' of the semiconductor substrate 100. A conductive well 115 is formed on the semiconductor substrate 100 corresponding to the peripheral area 'PA', in which the first and second switches 'SW1 and SW2' are formed, to provide optimal transistor conditions and a device isolation layer 110 for defining an active area (not shown) is formed in the cell area 'CA'.

The second word line 'WL2' is formed on the upper part of the semiconductor substrate 100, on which the first and second switches 'SW1 and SW2' are formed, putting a first insulating layer 120 therebetween. The second word line 'WL2' is electrically connected to a source of the second switch 'SW2'; and is formed on the upper part of the first insulating layer 120. The second word line 'WL2' can be formed of a doped polysilicon wire or a metal wire having excellent heat resistance property.

A second insulating layer 130 is formed on the upper part of the second word line 'WL2' and a plurality of second diodes 'D2' are formed in the second insulating layer 130 to contact the second word line 'WL2'. Herein, the second diodes 'D2' can be arranged at a predetermined interval so that the second diode can be provided at every memory cell 'MC' one by one. The second diode 'D2' has a vertical pn diode structure and can be divided into a schottky diode (when the second word line is formed of the doped polysilicon film) or a metal schottky diode (when the second word lines are a metal film) according to the physical properties of the second word line 'WL2'.

Next, the first word line 'WL1' is formed on the upper part of the second insulating layer 130 so that it can be electrically connected to the second diode 'D2'. The first word line 'WL1' can be electrically connected to the first switch 'SW1' using a conductive plug 132, which penetrates through the first and second insulating layers 120 and 130. Likewise the second word line 'WL2', the first word line 'WL1' can be formed of a doped polysilicon wire or a conductive wire having excellent heat resistance property.

A third insulating layer 135 is formed on the upper part of the first word line 'WL1' and a plurality of first diodes 'D1' are formed in the third insulating layer 135 to contact the first word line 'WL1'. The first diodes 'D1' can be arranged along a predetermined interval corresponding to the second diodes 'D2' so that the second diodes can be provided at every memory cell 'MC' one by one. The first diode 'D1' may also be a vertical pn diode structure and can be divided into a silicon schottky diode (when the first word line is formed of the doped polysilicon film) or a metal schottky diode (when the second word lines are a metal film) according to the physical properties of the lower first word line 'WL1'.

A fourth insulating layer 140 is formed on the upper part of the third insulating layer 135 on which the first diode 'D1' is formed. A heating electrode 150 is formed in the fourth insulating layer 140 to be electrically connected to each of the first diodes 'D1'. As the heating electrode 150, a conductive layer having relatively higher specific resistance, for example, a doped polysilicon layer, a silicon germanium layer, or a titanium metal layer, etc., can be used.

Phase change patterns 160 as the variable resistors 'Rv' are formed on the upper part of the fourth insulating layer 140 to correspond to each of the heating electrodes 150 and an upper electrode 165 is formed on the upper part of the phase change pattern 160.

A fifth insulating layer 170 is formed on the upper part of the fourth insulating layer 140 on which the upper electrode 165 and the phase change pattern 160 are formed and bit lines 180 are formed on the upper part of the fifth insulating layer 170 to correspond to each of the phase change patterns 160. Herein, the bit line 180 and the upper electrode 165 are electrically connected together by a via plug 175.

Figure 14:
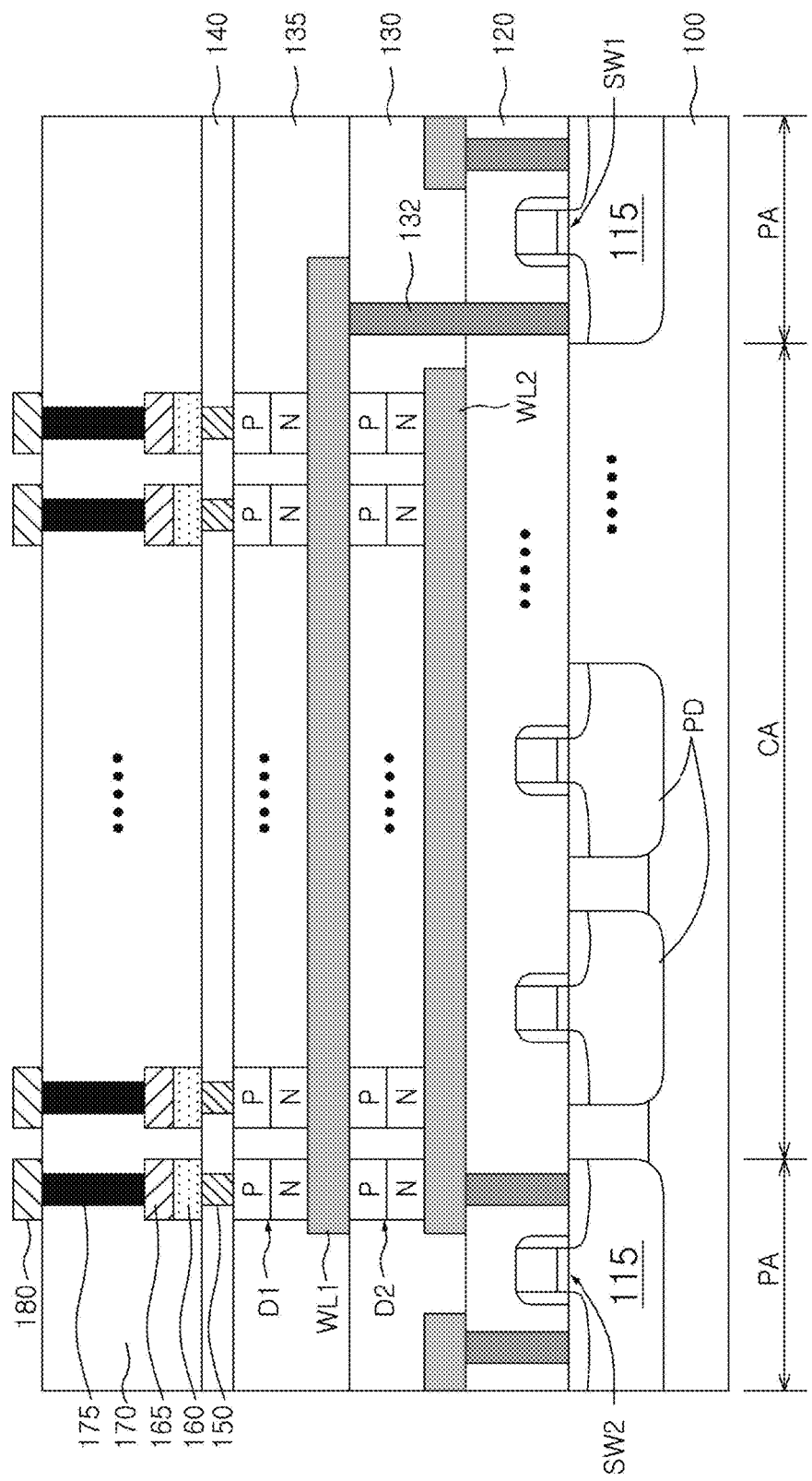
FIG. 14 is a cross-sectional view of a phase change memory device according to another embodiment.

As the phase change memory device arranges substantial devices on the upper part of the second word line 'WL2', there are no devices between the semiconductor substrate 100 and the second word line 'WL2' in the cell area 'CA'. As shown in FIG. 14, when the devices 'PD' formed in the peripheral area 'PA' are integrated on the semiconductor substrate 100 of the cell area 'CA', the area of the peripheral area 'PA' can be greatly reduced and the area of the cell area 'CA' can be increased by the reduced area of the peripheral area 'PA'.

As described above, with the embodiment, the shift unit including the plurality of switching elements connected to the variable resistors in series to shift the resistance distribution is installed.

As a result, the two phases having the clear resistance distribution are shifted by the threshold voltage of the switching element, making it possible to obtain the plurality of clear resistance distributions. Therefore, the multi-level can be achieved without including a separate write driver.

The embodiment is not limited to the foregoing embodiments.

Figure 15:
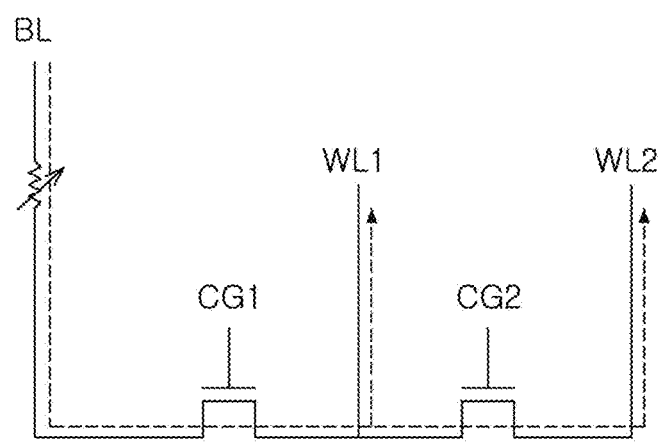
FIG. 15 is a memory cell circuit diagram of a phase change memory device according to another embodiment.

Although the embodiment describes the diodes 'D1 and D2' connected in series as the shift unit by way of example, as shown in FIG. 15, the MOS transistors N1 and N2 can be used as the switching element instead of the diodes 'D1 and D2'. In this case, the separate control signals 'CG1 and CG2' should be provided as the gates of each MOS transistors N1 and N2.

Further, although the embodiment describes two diodes 'D1 and D2' as the shifting unit and two word lines 'WL1 and WL2' for controlling the same by way of example, the embodiment is not limited thereto and can vary the number of the diodes and word lines.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A method of driving a phase change memory device that includes variable resistors that reversibly interchange into set and reset states in response to a current applied from bit lines, shifting units connected to the variable resistors and exhibits shift resistance distribution in the set and reset states of the variable resistors by a predetermined level, and memory cells that include a plurality of word lines controlling the shifting units, the method of driving a phase change memory comprising:

when writing and reading the memory cells, selecting and grounding one of the word lines, and supplying a writing and reading voltage via the bit lines to remaining word lines in a floating state.

2. The method of driving a phase change memory device of claim 1, further comprising: when writing the memory cell, sequentially grounding the word lines to shift a set and reset resistance distribution of the variable resistor.

3. The method of driving a phase change memory device of claim 1, further comprising: when writing the memory cell, applying read voltages having different levels of a holding voltage or less that a threshold voltage through the bit lines to determine each level based on the applied read voltage, wherein the applied read voltage does not cause the variable resistor to change solid state phases.

4. The method of driving a phase change memory device of claim 1, further comprising: when reading the memory cell, applying a first read voltage corresponding to a holding voltage or less then a threshold voltage through the bit lines to divide the variable resistors into a set group and a reset group such that the first read voltage does not cause the variable resistors to change solid state phases;

when divided the variable resistors into the set group, applying a second read voltage through the bit line to divide a detailed set state wherein the second read voltage having a lower voltage than the first read voltage; and when divided the variable resistors into the reset group, applying a third read voltage through the bit line to divide the detailed reset state wherein the third read voltage having a larger voltage than the first read voltage.

5. The method of driving a phase change memory device of claim 4, wherein dividing the set group and the reset group and dividing the detailed set and reset state are performed when different word lines are grounded.

* * * * *